(12) United States Patent
Chandrasekaran et al.

(10) Patent No.: US 8,451,581 B2
(45) Date of Patent: May 28, 2013

(54) PASSIVE COUPLER BETWEEN PACKAGE SUBSTRATE AND SYSTEM BOARD

(75) Inventors: Arvind Chandrasekaran, San Diego, CA (US); Jonghae Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 584 days.

(21) Appl. No.: 12/687,328

(22) Filed: Jan. 14, 2010

(65) Prior Publication Data

US 2011/0170231 A1 Jul. 14, 2011

(51) Int. Cl.
 *H01G 4/229* (2006.01)
 *H01F 21/02* (2006.01)
 *H01Q 1/52* (2006.01)

(52) U.S. Cl.
 USPC .................... 361/306.1; 336/30; 343/841

(58) Field of Classification Search
 USPC ... 336/330, 30; 343/841; 257/679; 361/306.1
 See application file for complete search history.

(56) References Cited

U.S. PATENT DOCUMENTS

| 2003/0100200 A1* | 5/2003 | Franzon et al. | 439/66 |
| 2006/0176624 A1 | 8/2006 | Kuroda et al. | |
| 2007/0164414 A1* | 7/2007 | Dokai et al. | 257/679 |
| 2008/0191956 A1* | 8/2008 | Watanabe | 343/841 |

FOREIGN PATENT DOCUMENTS

| EP | 2256861 A1 | 12/2010 |
| WO | WO2009119548 A1 | 10/2009 |

OTHER PUBLICATIONS

International Search Report and Written Opinion—PCT/US2011/021363, International Search Authority -European Patent Office—Apr. 7, 2011.

* cited by examiner

*Primary Examiner* — Eric Thomas
*Assistant Examiner* — Arun Ramaswamy
(74) *Attorney, Agent, or Firm* — Michelle Gallardo

(57) ABSTRACT

A passive device having a portion in the package substrate and a portion in the system board such that the portions of the device are electromagnetically coupled. A transformer including inductors in the package substrate and system board electromagnetically coupled across a space between the substrate and board that is surrounded by solder balls coupling the substrate and board. A capacitor including plates in the substrate and board electromagnetically coupled across a space between the substrate and board that is surrounded by solder balls coupling the substrate and board. A core material can at least partially fill the space between the substrate and board. The solder balls surrounding the space can be coupled to ground. Metal shielding can be put in the substrate and/or board surrounding the device. The metal shielding can be coupled to the solder balls. The metal shielding can be coupled to ground.

18 Claims, 6 Drawing Sheets

PASSIVE COUPLER BETWEEN PACKAGE SUBSTRATE AND SYSTEM BOARD

FIELD OF DISCLOSURE

The present disclosure relates generally to integrated circuit packaging and more specifically to placing portions of a passive device in each of the package substrate and the system board such that the portions of the device are connected by electromagnetic coupling.

BACKGROUND

Impedance matching between a signal processing system and an antenna can be an issue in radio-frequency (RF) integrated circuit applications, like power amplifiers and high frequency transceivers. Impedance matching is accomplished by designing the input impedance of an electrical load to be equal to the output impedance of the signal source to which it is ultimately connected. Impedance matching is usually done to maximize the power transfer and minimize reflections from the load. Lack of impedance matching can cause undesirable power losses, thermal heating, echoes and other issues.

Additional elements are often required inside or outside of the package to obtain the desired matching. External discrete passives and integrated passive devices external or internal to the package can be used as matching elements. These additional elements can consume valuable package area or system board area which can add to the system cost and can also add to the size of the system package. However, it is desirable to minimize both the system cost and size.

Capacitive coupling can be an issue when it is desirable to remove the constant DC components of a signal while transmitting the varying AC components. The resulting signals are sometimes called DC balanced signals. Capacitive coupling is the transfer of energy within an electrical network by means of the capacitance between circuit nodes, and is usually done by placing a capacitor in series in the signal path. The capacitor allows the AC component of the signal to pass across the capacitor but blocks the DC component of the signal. The resulting DC-balanced signals can be useful in communications systems, since they can be used over AC-coupled electrical connections to avoid voltage imbalance problems and charge accumulation between connected systems or components.

It would be desirable to have a methodology to implement electromagnetic coupling in integrated circuit design, such as impedance matching or capacitive coupling, that has a minimal impact on system cost, system size and other desirable factors.

SUMMARY

A novel electromagnetic coupling method is disclosed that makes use of the available space on an integrated circuit package to implement passive devices, such as a transformer or a capacitor, as part of the package construction process. This method can use existing integrated circuit manufacturing processes. The transformer or capacitor can be used for purposes other than impedance matching or capacitive coupling, such as voltage conversion and other applications.

An embodiment of the passive device can include a first portion of the passive device in a package substrate, and a second portion of the passive device in a system board where the second portion of the passive device is electromagnetically coupled to the first portion of the passive device across a coupling space between the package substrate and the system board. The coupling space between the package substrate and the system board is surrounded by a plurality of solder balls that couple the package substrate to the system board. The passive device can also include a core material that at least partially fills the coupling space between the package substrate and the system board. The plurality of solder balls surrounding the coupling space between the package substrate and the system board can be coupled to ground.

Embodiments of the passive device can also include metal shielding in the package substrate and/or the system board to reduce electromagnetic interference from the passive device. The plurality of solder balls surrounding the coupling space between the package substrate and the system board can be coupled to the metal shielding in the package substrate and/or the metal shielding in the system board. All or parts of the metal shielding can be coupled to ground.

An embodiment of the passive device can be a transformer that includes a first inductor in a package substrate and a second inductor in a system board, where the second inductor is electromagnetically coupled to the first inductor across a coupling space between the package substrate and the system board. The coupling space between the package substrate and the system board is surrounded by a plurality of solder balls that couple the package substrate to the system board. A ferromagnetic material can at least partially fills the coupling space between the package substrate and the system board. The he first inductor and the second inductor can be coupled to one of the plurality of solder balls surrounding the coupling space between the package substrate and the system board, where that one of the plurality of solder balls is coupled to ground. The plurality of solder balls surrounding the coupling space between the package substrate and the system board can be coupled to ground. The passive device can also include metal shielding in the package substrate and/or the in the system board surrounding the transformer. All or part of the metal shielding can be coupled to ground. The first inductor can be coupled to a radio-frequency circuit and the second inductor can be coupled to an antenna. The transformer can be adapted to be the only passive circuit in the path between the radio-frequency circuit and the antenna.

An embodiment of the passive device can be a capacitor that includes a first capacitive plate in a package substrate and a second capacitive plate in a system board, where the second capacitive plate is electromagnetically coupled to the first capacitive plate across a coupling space between the package substrate and the system board. The coupling space between the package substrate and the system board is surrounded by a plurality of solder balls that couple the package substrate to the system board. The capacitor can also include dielectric material that at least partially fills the coupling space between the package substrate and the system board. The plurality of solder balls surrounding the coupling space between the package substrate and the system board can be coupled to ground. The passive device can also include shielding in the package substrate and/or the system board surrounding the capacitor. All or part of the metal shielding can be coupled to ground.

The passive device can include metal shielding in the package substrate on the opposite side of the first portion of the passive device from the second portion of the passive device and/or metal shielding in the system board on the opposite side of the second portion of the passive device from the first portion of the passive device. The metal shielding in the package substrate and the metal shielding in the system board can be coupled to ground. The plurality of solder balls surrounding the coupling space between the package substrate and the system board can be coupled to the metal shielding in the package substrate and the metal shielding in the system board.

A transformer is disclosed that includes a first inductor in a package substrate and a second inductor in a system board, where the second inductor is electromagnetically coupled to the first inductor across a coupling space between the package substrate and the system board. The coupling space between the package substrate and the system board is surrounded by a plurality of solder balls that couple the package substrate to the system board. The transformer can also include a ferromagnetic material that at least partially fills the coupling space between the package substrate and the system board. The first and second inductors can be coupled to one of the plurality of solder balls surrounding the coupling space where that one of the plurality of solder balls is coupled to ground. The plurality of solder balls surrounding the coupling space can be coupled to ground.

The transformer can also include metal shielding in the package substrate and/or the system board surrounding the transformer. The metal shielding in the package substrate and/or the metal shielding in the system board can be coupled to ground.

The transformer can be part of system wherein the first inductor is coupled to a radio-frequency circuit and the second inductor is coupled to an antenna. The transformer can be adapted to be the only passive circuit in the path between the radio-frequency circuit and the antenna.

A capacitor is disclosed that includes a first capacitive plate in a package substrate and a second capacitive plate in a system board, where the second capacitive plate is electromagnetically coupled to the first capacitive plate across a coupling space between the package substrate and the system board. The coupling space between the package substrate and the system board is surrounded by a plurality of solder balls that couple the package substrate to the system board. The capacitor can also include a dielectric material that at least partially fills the coupling space. The plurality of solder balls surrounding the coupling space can be coupled to ground.

The capacitor can also include metal shielding in the package substrate and metal shielding in the system board surrounding the capacitor. The metal shielding in the package substrate and the metal shielding in the system board can be coupled to ground.

For a more complete understanding of the present disclosure, reference is now made to the following detailed description and the accompanying drawings.

DETAILED DESCRIPTION

Figure 1:
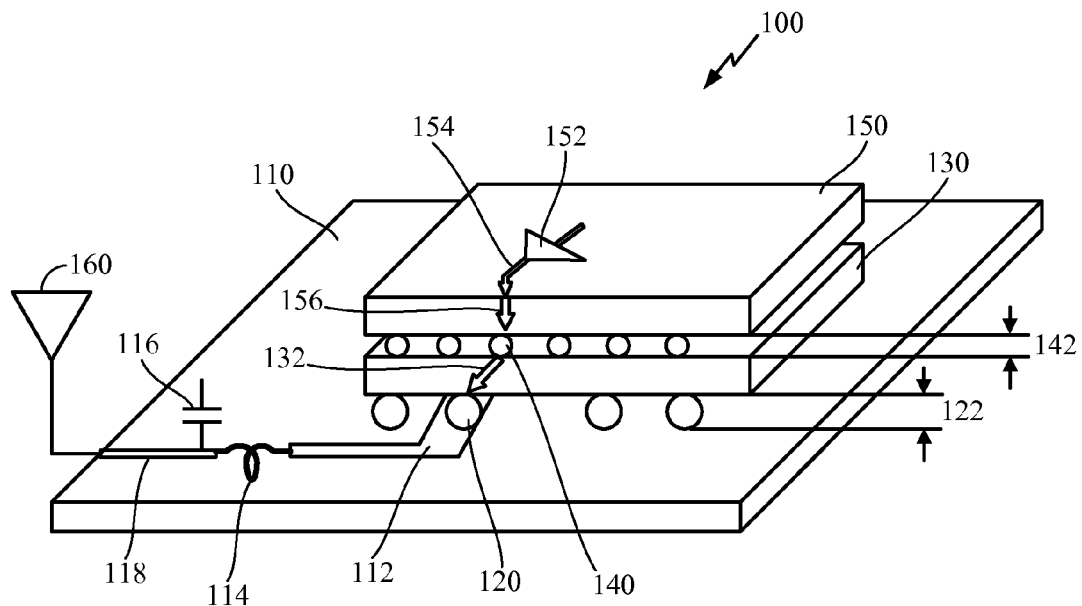
FIG. 1 is an exemplary radio-frequency (RF) integrated circuit system.

FIG. 1 shows an exemplary radio-frequency (RF) integrated circuit system 100. The RF integrated circuit system 100 includes a system printed circuit board 110, a packaging substrate 130, a complementary metal-oxide semiconductor (CMOS) die 150 and an antenna 160.

The CMOS die 150 includes a plurality of micro-bumps 140 that couple the CMOS die 150 to the packaging substrate 130. The CMOS die 150 also includes an RF power amplifier 152 that is coupled to the antenna 160. The power amplifier 152 is implemented in the metal layers and silicon substrate of the CMOS die 150. FIG. 1 shows the power amplifier 152 coupled to a metal layer 154 which is coupled to a through-silicon via (TSV) 156 which is coupled to one of the plurality of micro-bumps 140. Note that the power amplifier 152 could be implemented at the top (as shown in FIG. 1) or at the bottom of the CMOS die 150. For example, in a flip-chip arrangement, the CMOS die 150 would be flipped so that the power amplifier 152 would be at the bottom (closest to the package substrate 130), thus the power amplifier 152 could be coupled to a metal layer that is coupled to one of the plurality of micro-bumps without using a TSV.

The packaging substrate 130 includes a plurality of solder balls 120 that couple the packaging substrate 130 to the system board 110. The packaging substrate 130 can also include metal layers and interconnects coupling various circuits and elements. FIG. 1 shows the micro-bump 140, to which the power amplifier 152 is coupled, coupled to an interconnect 132 which is coupled to one of the plurality of solder balls 120.

The system board 110 can include a plurality of metal layers and signal paths to couple various circuits and elements. FIG. 1 shows the solder ball 120, to which the power amplifier 152 is coupled, coupled to a first conductive trace 112 which is coupled to a board inductor 114, which is coupled to a board capacitor 116, which is coupled to a second conductive trace 118, which is coupled to the antenna 160. The board inductor 114 and the board capacitor 116 can be used as matching components to match the impedance along the path between the power amplifier 152 and the antenna 160.

Thus, the signal path between the power amplifier 152 and the antenna 160 in the exemplary RF integrated circuit system 100 shown in FIG. 1 includes the following couplings: the power amplifier 152 on the CMOS die 150 is coupled to the metal layer 154, which is coupled to the through silicon via (TSV) 156, which is coupled to one of the plurality of micro-bumps 140 coupling the CMOS die 150 to the packaging substrate 130. The micro-bump 140 to which the power amplifier 152 is coupled, is coupled to the interconnect 132, which is coupled to one of the plurality of solder balls 120 coupling the packaging substrate 130 to the system board 110. The solder ball 120 to which the power amplifier 152 is coupled, is coupled to the first conductive trace 112, which is coupled to the board inductor 114 and the board capacitor 116, which is coupled to a second conductive trace 118, which is coupled to the antenna 160. The board inductor 114 and the board capacitor 116 can be used as matching components to match the impedance between the antenna 160 and the circuit path leading to the power amplifier 152. Additional matching components can be implemented along the signal path between the power amplifier 152 and the antenna 160.

FIG. 1 also shows a board-substrate distance 122 between the top of the system board 110 and the bottom of the packaging substrate 130, and a substrate-die distance 142 between the top of the packaging substrate 130 and the bottom of the CMOS die 150. A typical measurement for the board-substrate distance 122 is about 200 μm, and for the substrate-die distance 142 is about 50 μm. The board-substrate distance 122 between the top of the system board 110 and the bottom of the packaging substrate 130 is large enough to be used for situating passive components, such as a transformer or capacitor, that perform matching or other desired functions in the integrated circuit system 100.

Figure 2:
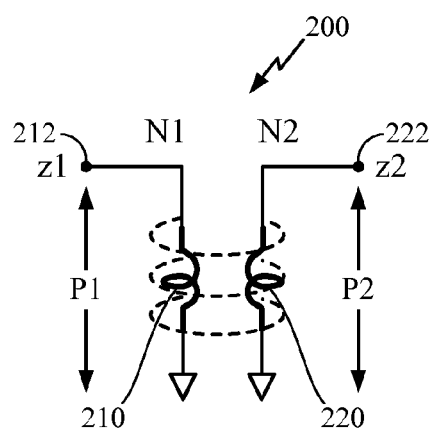
FIG. 2 is an exemplary diagram of a transformer.

FIG. 2 is an exemplary diagram of a transformer 200. The transformer 200 includes a first inductor 210 and a second inductor 220 separated by a gap between the two inductors 210, 220. An inductor can be a conductor shaped as a coil which includes one or more "turns." The turns concentrate the magnetic field flux induced by current flowing through each turn of the conductor in an "inductive" area within the inductor turns. The number of turns and the size of the turns affect the inductance. In this exemplary embodiment, the first inductor 210 has N1 turns and is coupled between a first node 212 and ground. The second inductor 220 has N2 turns and is coupled between a second node 222 and ground.

Two or more inductors which have coupled magnetic flux form a transformer, which is a device that transfers electrical energy from one circuit to another. A varying current in the first inductor 210 will induce a varying voltage in the second inductor 220. A signal source can be coupled to the first node 212 and a load can be coupled to the second node 222. A varying current from the signal source flowing through the first inductor 210 will, through inductive coupling, induce a varying voltage in the second inductor 220 which will cause a current to flow through the second inductor 220 and electrical energy to flow from the source circuit coupled at the first node 212 through the transformer 200 to the load coupled at the second node 222.

A transformer can be used for impedance matching. The relationship between the impedance Z1 at the first node 212 and the impedance Z2 at the second node 222 is Z2=(N2/N1)$^2$*Z1, where N1 and N2 are the number of turns in the first inductor 210 and the second inductor 220, respectively. For example, if N1=1 turn, N2=4 turns and Z1=50Ω; then Z2=16*50Ω=800Ω. Thus, in this example, the transformer 200 could match a 50Ω source output impedance to a 800Ω load input impedance.

Figure 3:
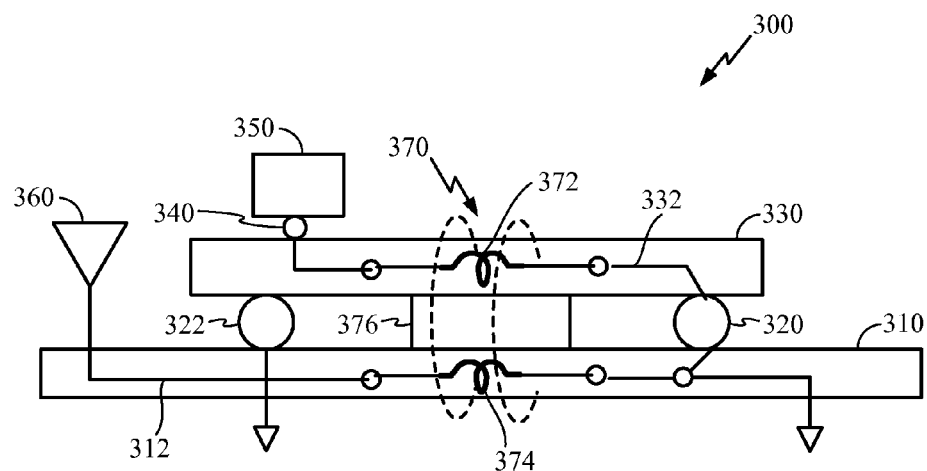
FIG. 3 is an exemplary implementation of a transformer between a substrate and a system board.

FIG. 3 is an exemplary implementation of an RF integrated circuit system 300 that includes a transformer 370 between a substrate 330 and a system board 310. The transformer 370 includes a substrate inductor 372 and a board inductor 374. A core material 376, such as a ferromagnetic material, can be placed between the substrate inductor 372 and the board inductor 374 in the coupling space between the substrate 330 and the system board 310. Some exemplary ferromagnetic materials include nickel, cobalt, iron and mumetal. Alternatively, the coupling space between the substrate inductor 372 and the board inductor 374 that is between the substrate 330 and the system board 310 can be left open and the inductive coupling can be across the resulting gap. One or more solder bumps may be omitted in the array of solder bumps on the substrate 330 to leave room for the electromagnetic coupling between the substrate inductor 372 and the board inductor 374. If the implementation includes the core material 376, it can be placed in the coupling space between the substrate 330 and the system board 310 during ball mount or during board assembly of the package. The core 376 can include solderable areas for affixing the core 376 to the substrate 330 during the ball mount process, or to the substrate 330 and/or the system board 310 during board assembly of the package.

The exemplary RF system 300 includes an RF die 350 which sends signals to and/or receives signals from an antenna 360. The RF die 350 includes a plurality of micro-bumps coupling the RF die 350 to the substrate 330 of which one micro-bump 340 is shown. The substrate 330 includes a plurality of solder bumps coupling the substrate 330 to the system board 310, of which two solder bumps 320 and 322 are shown. The substrate inductor 372 is located in a substrate signal path 332 running through the substrate 330 between the micro-bump 340 and the solder ball 320. The board inductor 374 is located in a board signal path 312 running through the system board 310 between the solder bump 320 and the antenna 360. The solder bump 320 is coupled to ground.

Thus, the signal path between the RF die 350 and the antenna 360 in the exemplary RF integrated circuit system 300 shown in FIG. 3 includes the following couplings: the RF die 350 is coupled to the micro-bump 340 which is one of the micro-bumps coupling the RF die 350 to the substrate 330. The micro-bump 340 is coupled to the substrate signal path 332 which includes the substrate inductor 372. The substrate inductor 372 is inductively coupled across the transformer 370 to the board inductor 374 which is in the board signal path 312 that is coupled to the antenna 360.

This embodiment integrates impedance matching between the RF die 350 and the antenna 360 into the package construction. Conventionally, implementing an inductor in the system board is relatively inexpensive, implementing an inductor in the packaging substrate is more expensive, and implementing an inductor in the die, such as CMOS dies, is even more expensive. Thus, placing the transformer between the system board and the packaging substrate uses existing board area, reduces or eliminates the need for additional or external matching elements, and reduces or eliminates the cost of placing matching elements in the die. The transformer can also be used in other applications; for example, voltage conversion.

FIG. 3 also shows both of the solder balls 320 and 322 coupled to ground. Coupling the solder balls surrounding the transformer 370 to ground helps prevent the electromagnetic field in the transformer 370 from interfering with other circuits in the system 300. In an actual implementation, the solder balls are distributed in a two-dimensional array between the substrate 330 and the system board 310. The solder balls on all sides of the transformer 370 can be grounded to shield the rest of the package from the resulting electromagnetic field. If additional shielding in the substrate 330 or the system board 310 is desired, a metal layer or metal mesh can be implemented in the substrate 330 and/or the system board 310 to surround the top and bottom of the transformer 370. Even further shielding can be implemented by placing metal pillars in the substrate 330 and/or the system board 310 to block the electromagnetic field from the sides of the transformer 370 above and below the solder balls. The metal pillars can be coupled to the solder balls and to a metal layer or mesh in the substrate 330 and system board 310 to form a shielding cage around the transformer 370. The shielding cage can be coupled to ground. The spacing between "bars" in this shielding cage can be a function of the expected wavelength of the electromagnetic energy in the transformer. Any such shielding should take into account the space for the transformer inputs and outputs to be coupled to the desired circuitry.

Figure 4:
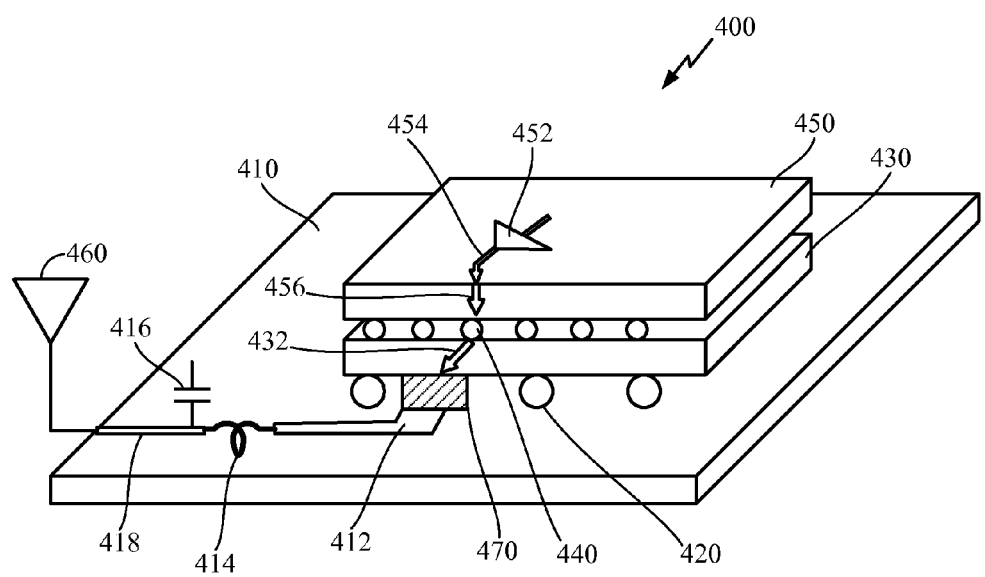
FIG. 4 is an exemplary RF integrated circuit system utilizing a transformer implemented between a substrate and a system board.

FIG. 4 shows an exemplary radio-frequency (RF) integrated circuit system 400, similar to the system 100 of FIG. 1. The RF integrated circuit system 400 includes a system printed circuit board 410, a packaging substrate 430, a CMOS die 450 and an antenna 460. The RF system 400 also includes an inductor 470 similar to the inductor 370 of FIG. 3. The inductor 470 includes a substrate inductor (not shown) in the substrate 430, a board inductor (not shown) in the system board 410 and a transformer core between the substrate inductor and the board inductor.

The CMOS die 450 includes a plurality of micro-bumps that couple the CMOS die 450 to the packaging substrate 430. The CMOS die 450 also includes an RF power amplifier 452 that is coupled to the antenna 460. The packaging substrate 430 includes a plurality of solder balls that couple the packaging substrate 430 to the system board 410. The antenna 460 is coupled to the system board 410.

The power amplifier 452 is coupled to a metal layer 454 which is coupled to a through-silicon via (TSV) 456 which is coupled to a micro-bump 440 which is coupled to the packaging substrate 430. The micro-bump 440 is coupled to an interconnect 432 which is coupled to the substrate inductor of the transformer 470. The substrate inductor is inductively coupled to the board inductor of the transformer 470. The board inductor of the transformer 470 is coupled to a first conductive trace 412 which is coupled to a second board inductor 414, which is coupled to a board capacitor 416, which is coupled to a second conductive trace 418, which is coupled to the antenna 460. Depending on the properties of the transformer 470 and the desired level of matching, the second board inductor 414 and/or the board capacitor 416 can be omitted due to the matching provided by the transformer 470.

As explained above, the transformer 470 can be surrounded by metal shielding that leaves room for the transformer circuit connections, the metal shielding blocking electromagnetic interference between the transformer 470 and other circuitry of the system 400. The metal shielding can be left floating or can be coupled to ground. The metal shielding can include one or more of: the solder balls surrounding the transformer 470; metal layers or mesh in the substrate 430 above the substrate inductor of the transformer 470; metal layers or mesh in the system board 410 below the board inductor of the transformer 470; and vertical metal pillars in the substrate and/or system board surrounding the transformer 470. The metal pillars can couple the solder balls to the metal layers or mesh. Some exemplary shielding embodiments are explained in more detail below.

Figure 5:
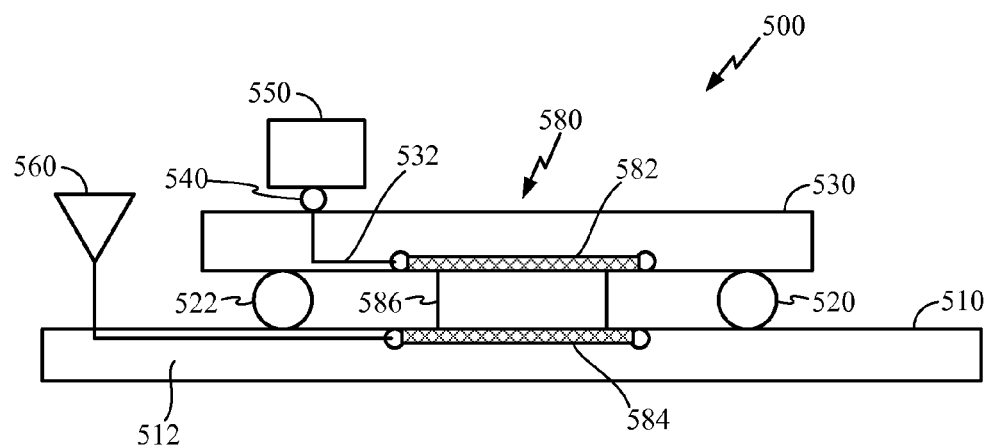
FIG. 5 is an exemplary implementation of a capacitor between a substrate and a system board.

FIG. 5 is an exemplary implementation of an integrated circuit system 500 that includes a capacitor 580 between a substrate 530 and a system board 510. The capacitor 580 includes a substrate plate 582 in the substrate 530, a board plate 584 in the system board 510 and may include a dielectric core 586 between the substrate plate 582 and the board plate 584 in the coupling space between the substrate 530 and the system board 510. Some exemplary dielectric materials include silicon dioxide, epoxy, glass and quartz. Alternatively, the coupling space between the substrate plate 582 and the board plate 584 that is between the substrate 530 and the system board 510 can be left open and the capacitive coupling can be across the resulting gap. One or more solder bumps may be omitted in the array of solder bumps on the substrate 530 to leave room for the capacitive coupling between the substrate plate 582 and the board plate 584. If the implementation includes the dielectric core 586, it can be placed in the coupling space between the substrate 530 and the system board 510 during ball mount or during board assembly of the package. The dielectric core 586 can include solderable areas for affixing the core 586 to the substrate 530 during the ball mount process, or to the substrate 530 and/or the system board 510 during board assembly of the package.

The exemplary system 500 includes a die 550 which sends signals to and/or receives signals from an antenna 560. The die 550 includes a plurality of micro-bumps coupling the die 550 to the substrate 530 of which one micro-bump 540 is shown. The substrate 530 includes a plurality of solder bumps coupling the substrate 530 to the system board 510, of which two solder bumps 520 and 522 are shown. The substrate plate 582 is located in a substrate signal path 532 running through the substrate 530 and coupled to the micro-bump 540. The board plate 584 is located in a board signal path 512 running through the system board 510 and coupled to the antenna 560.

Thus, the signal path between the die 550 and the antenna 560 in the exemplary integrated circuit system 500 shown in FIG. 5 includes the following couplings: the die 550 is coupled to the micro-bump 540 which is one of the micro-bumps coupling the die 550 to the substrate 530. The micro-bump 540 is coupled to the substrate signal path 532 which includes the substrate plate 582. The substrate plate 582 is capacitively coupled across the capacitor 580 to the board plate 584 which is in the board signal path 512 that is coupled to the antenna 560.

This embodiment integrates capacitive coupling between the die 550 and the antenna 560 into the package construction. Conventionally, implementing a capacitor in the system board is relatively inexpensive, implementing a capacitor in the packaging substrate is more expensive, and implementing a capacitor in the die is even more expensive. Thus, placing the capacitor between the system board and the packaging substrate uses existing board area, reduces or eliminates the need for additional or external elements, and reduces or eliminates the cost of placing extra elements in the die.

As described above with regard to the transformer, the solder balls 520 and 522 surrounding the capacitor 580 can be coupled to ground. Coupling the solder balls surrounding the capacitor 580 to ground helps prevent the electromagnetic field in the capacitor 580 from interfering with other circuits in the system 500. In an actual implementation, the solder balls are distributed in a two-dimensional array between the substrate 530 and the system board 510. The solder balls on all sides of the capacitor 580 can be grounded to shield the rest of the package from the electromagnetic field. If additional shielding in the substrate 530 or the system board 510 is desired, a metal layer or metal mesh can be implemented in the substrate 530 and/or the system board 510 to surround the top and bottom of the capacitor 580. Even further shielding can be implemented by placing metal pillars in the substrate 530 and/or the system board 510 to block the electromagnetic field from the sides of the capacitor 580 above and below the solder balls. The metal pillars can be coupled to the solder balls and to a metal layer or mesh in the substrate 530 and system board 510 to form a shielding cage around the capacitor 580. The shielding cage can also be coupled to ground. The spacing between "bars" in this shielding cage can be a function of the expected wavelength of the electromagnetic energy in the capacitor. Such shielding should include space for the capacitor inputs and outputs to be coupled to the desired circuitry. Some exemplary shielding embodiments are explained in more detail below.

Figure 6:
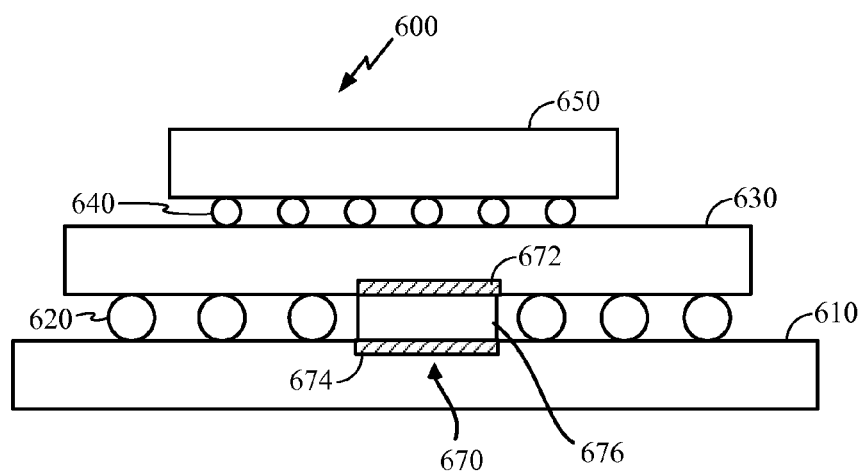
FIG. 6 is a vertical cross-section of an exemplary implementation of a passive coupler between a substrate and a system board.

FIG. 6 is a vertical cross-section of an exemplary integrated circuit system 600 that includes a system printed circuit board 610, a packaging substrate 630, a die 650 and a passive coupler 670 between the system board 610 and the packaging substrate 630. A plurality of micro-bumps 640 couple the die 650 to the packaging substrate 630. A plurality of solder balls 620 that couple the packaging substrate 630 to the system board 610.

The passive coupler 670 could be a transformer or a capacitor. The passive coupler 670 includes a board element 674 and a substrate element 672 that are electromagnetically coupled across a core material 676. The passive coupler 670 can be used in conjunction with a circuit disposed in the die 650, packaging substrate 630, system board 610 or any combination thereof.

Figure 7:
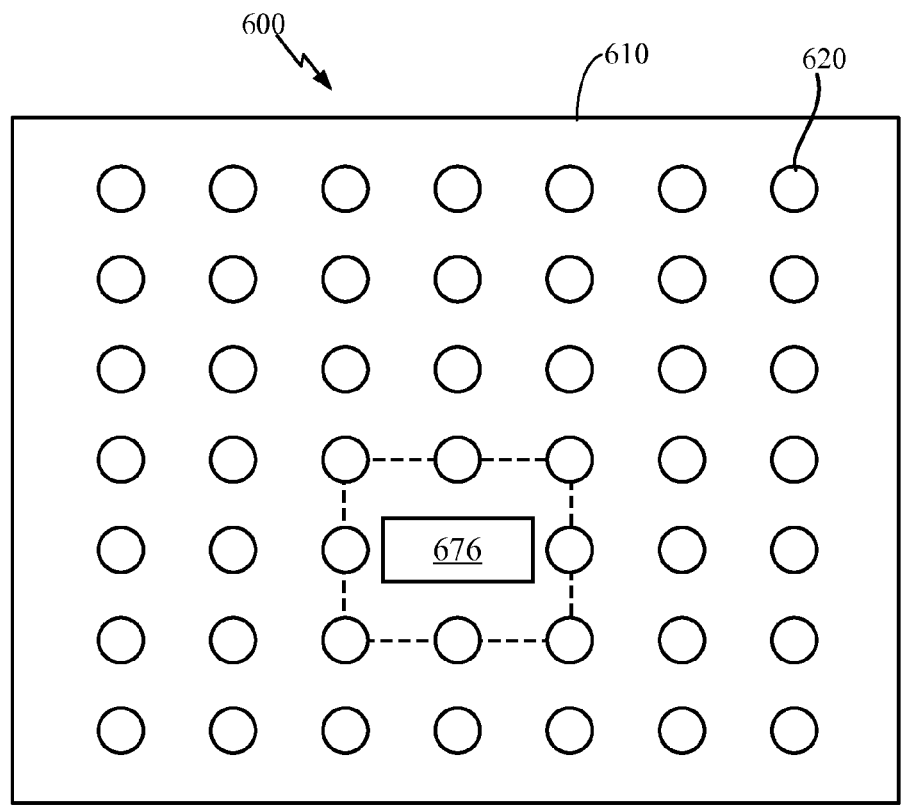
FIG. 7 is a horizontal cross-section between the substrate and the system board of the exemplary implementation of the passive coupler in FIG. 6.

FIG. 7 is a horizontal cross-section between the system board 610 and the packaging substrate 630 of the exemplary integrated circuit system 600 shown in FIG. 6. FIG. 7 shows the plurality of solder balls 620 that couple the packaging substrate 630 to the system board 610 organized in a two-dimensional array. In this embodiment, the passive coupler is located off-center in the two-dimensional array of solder balls 620 and the core material 676 is located in place of one of the solder balls 620. The passive coupler 670 could be located at the center, on the edge, or anywhere in-between in the plurality of solder balls 620 coupling the packaging substrate 630 to the system board 610. The dashed line connecting the eight solder balls 620 adjacent to the core material 676 of the passive coupler 670 indicates that those eight solder balls 620 can be coupled to provide shielding of the surrounding circuitry in the integrated circuit system 600 from electromagnetic interference from the passive coupler 670. The adjacent solder balls can be connected to ground or allowed to maintain a floating potential.

Figure 8:
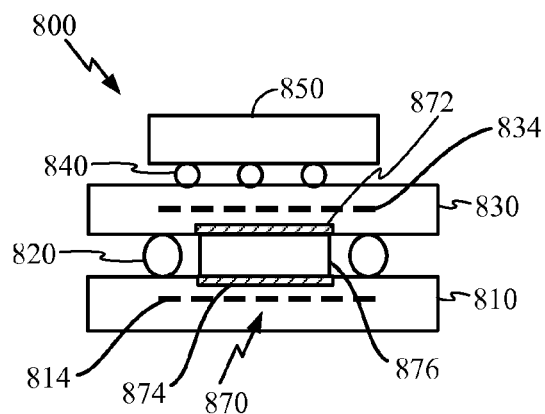
FIG. 8 is a vertical cross-section of an exemplary implementation of a passive coupler between a substrate and a system board with shielding layers.

FIG. 8 is a vertical cross-section of a portion of an exemplary integrated circuit system 800 that includes a system printed circuit board 810, a packaging substrate 830, a die 850 and a passive coupler 870 between the system board 810 and the packaging substrate 830. This embodiment also includes a substrate shielding layer 834 in the packaging substrate 830 and a board shielding layer 814 in the system board 810. A plurality of micro-bumps 840 couple the die 850 to the packaging substrate 830. A plurality of solder balls 820 that couple the packaging substrate 830 to the system board 810. For clarity, FIG. 8 only shows the portion of the system 800 adjacent to the passive coupler 870.

The passive coupler 870 could be a transformer or a capacitor. The passive coupler 870 includes a board element 874 and a substrate element 872 that are electromagnetically coupled across a core material 876. The passive coupler 870 can be used in conjunction with a circuit disposed in the die 850, the packaging substrate 830, the system board 810 or any combination thereof. The board shielding layer 814 and substrate shielding layer 834 help electromagnetic interference from the passive coupler 870 from interfering with other circuitry in the system 800. The board shielding layer 814 can be connected to ground or allowed to maintain a floating potential. The substrate shielding layer 834 can also be connected to ground or allowed to maintain a floating potential. Either or both of the board shielding layer 814 and the substrate shielding layer 834 can be connected to one or more of the solder balls 820 surrounding the passive coupler 870.

Figure 9:
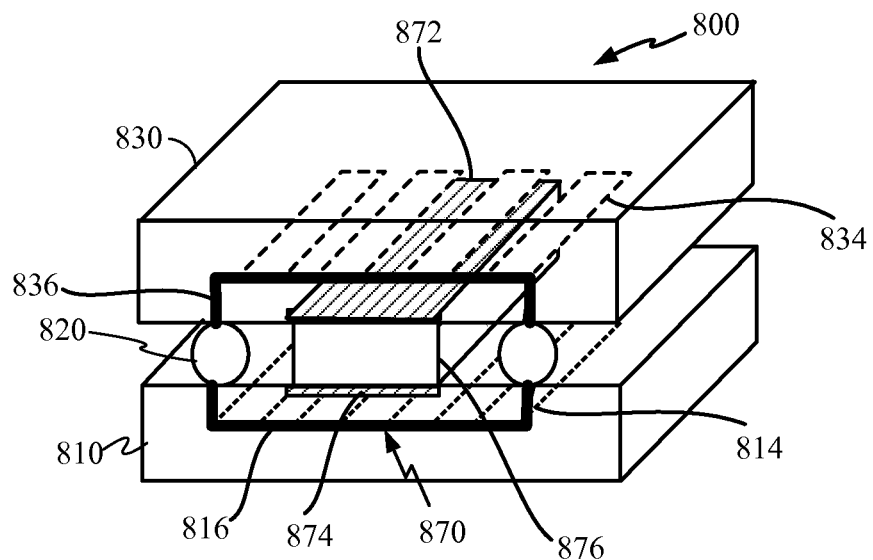
FIG. 9 is a vertical cross-section of a perspective view of the substrate and system board of the exemplary implementation of the passive coupler in FIG. 8 showing shielding conductors in the substrate and system board.

FIG. 9 is a vertical cross-section of a perspective view of the system board 810 and the packaging substrate 830 of the exemplary system 800. In FIG. 9, the system board 810 and the packaging substrate 830 are shown as partially transparent to show the substrate shielding layer 834 extending through the packaging substrate 830, the board shielding layer 814 extending through the system board 810, and the passive coupler 870 extending therebetween. In this embodiment, the substrate shielding layer 834 includes four shielding conductors spaced apart in the package substrate 830 above the substrate element 872 of the passive coupler 870; and the board shielding layer 814 includes four shielding conductors spaced apart in the system board 810 below the board element 874 of the passive coupler 870. FIG. 9 also shows a board conductor 816 coupling the four shielding conductors of the board shielding layer 814 and the two solder balls 820 shown adjacent to the passive coupler 870; and a substrate conductor 836 coupling the four shielding conductors of the substrate shielding layer 834 and the two solder balls 820 shown adjacent to the passive coupler 870. The board shielding layer 814, board conductor 816, substrate shielding layer 834, substrate conductor 836 and the solder balls 820 adjacent to the passive coupler 870 can be used to form a shielding cage around the passive coupler 870 to help prevent electromagnetic interference from the passive coupler 870 from interfering with other circuitry in the system 800. The shielding cage may be coupled to a source such as ground, or may be left at a floating potential.

Figure 10:
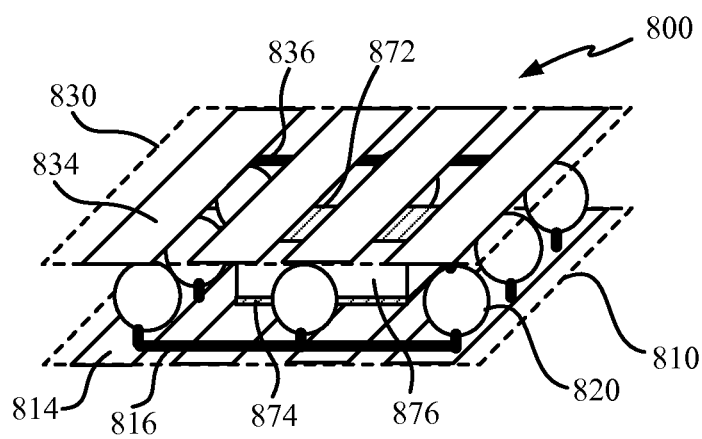
FIG. 10 is a perspective view of the area surrounding the passive coupler in FIG. 8 with invisible substrate and system board to show underlying structure.

FIG. 10 is a perspective view of the board shielding layer 814, the substrate shielding layer 834 and the solder balls 820 surrounding the passive coupler 870 of the exemplary system 800. In FIG. 10, the system board 810 and the package substrate 830 are represented only by dotted lines for clarity. The substrate shielding layer 834 in the package substrate 830 is interconnected by the substrate conductor 836, and pillars of the substrate conductor 836 connect each of the solder balls 820 surrounding the passive coupler 870 to the substrate shielding layer 834. The board shielding layer 814 in the system board 810 is interconnected by the board conductor 816, and pillars of the board conductor 816 connect each of the solder balls 820 surrounding the passive coupler 870 to the board shielding layer 814. The coupling of the board shielding layer 814, board conductor 816, substrate shielding layer 834, substrate conductor 836 and the solder balls 820 surrounding the passive coupler 870 form a shielding cage around the passive coupler 870. The shielding cage may be coupled to a source such as ground, or may be left at a floating potential. The shielding cage surrounding the passive coupler 870 includes space for connecting to the substrate element 872 and the board element 874 of the passive coupler 870 so that the passive coupler 870 can be included in circuitry of the system 800.

Figure 11:
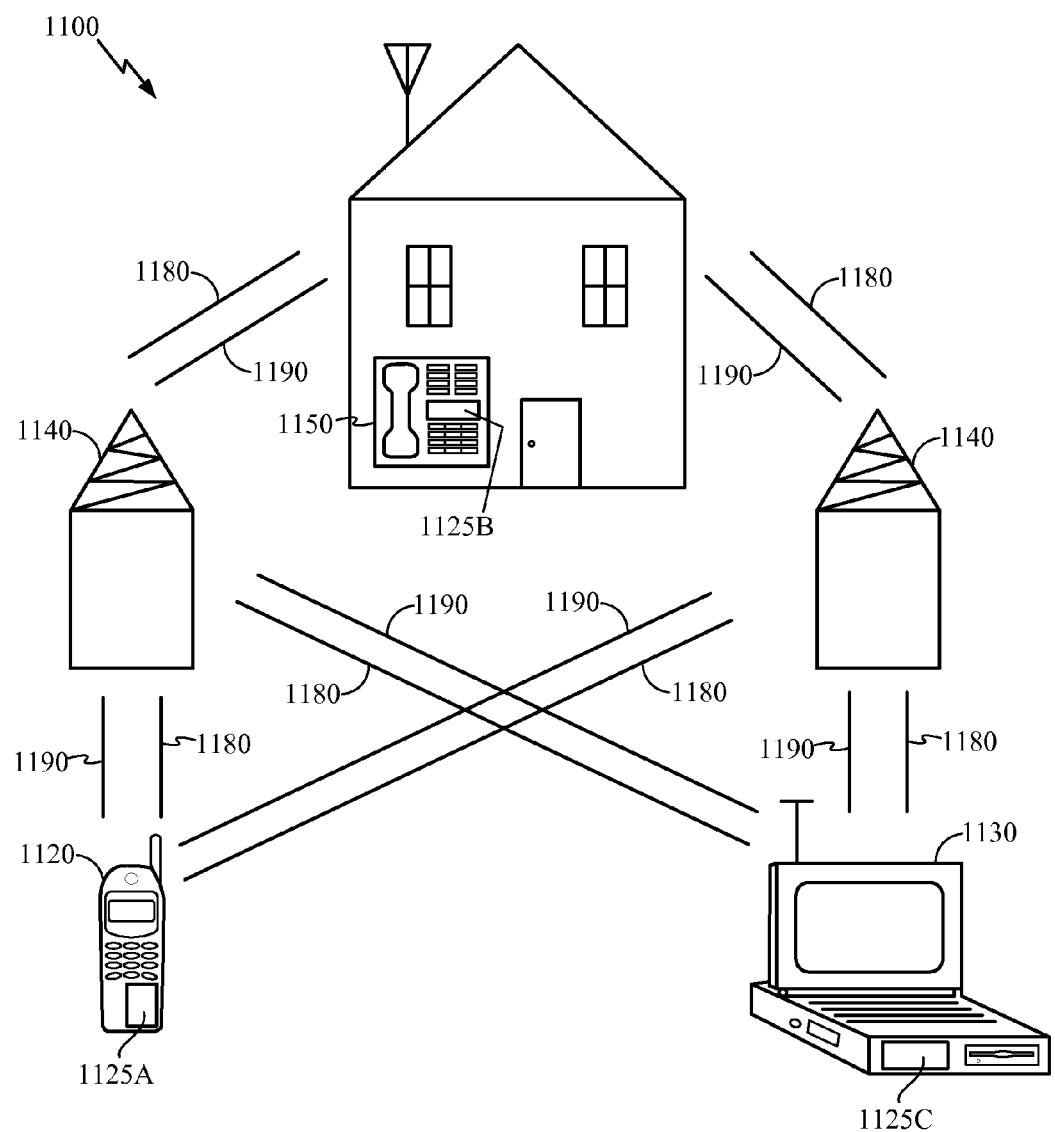
FIG. 11 is a block diagram showing an exemplary wireless communication system in which an electromagnetically coupled device between the package substrate and the system board may be advantageously employed.

FIG. 11 shows an exemplary wireless communication system 1100 in which electromagnetic coupling between the package substrate and the system board may be advantageously employed. For purposes of illustration, FIG. 11 shows three remote units 1120, 1130, and 1150 and two base stations 1140. It should be recognized that typical wireless communication systems may have many more remote units and base stations. Any of remote units 1120, 1130, and 1150 may include electromagnetic coupling between the package substrate and the system board as disclosed herein. FIG. 11 shows forward link signals 1180 from the base stations 1140 and the remote units 1120, 1130, and 1150 and reverse link signals 1190 from the remote units 1120, 630, and 1150 to base stations 1140.

In FIG. 11, remote unit 1120 is shown as a mobile telephone, remote unit 1130 is shown as a portable computer, and remote unit 1150 is shown as a fixed location remote unit in a wireless local loop system. For example, the remote units may be cell phones, hand-held personal communication systems (PCS) units, portable data units such as personal data assistants, or fixed location data units such as meter reading equipment. Although FIG. 11 illustrates certain exemplary remote units that may include components having electromagnetic coupling between the package substrate and the system board as disclosed herein, the use of electromagnetic coupling between the package substrate and the system board is not limited to these exemplary illustrated units. Embodiments may be suitably employed in any electronic device in which electromagnetic coupling between the package substrate and the system board as disclosed herein is desired.

While exemplary embodiments incorporating the principles of the present invention have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

We claim:

1. A passive device comprising:
   a first portion of the passive device in a package substrate, wherein the package substrate comprises metal shielding;
   a second portion of the passive device in a system board, wherein the system board surrounding the passive device comprises metal shielding, the second portion of the passive device being electromagnetically coupled to the first portion of the passive device across a coupling space between the package substrate and the system board; and
   wherein the coupling space between the package substrate and the system board is surrounded by a plurality of solder balls that couple the package substrate to the system board, wherein the plurality of solder balls surrounding the coupling space between the package substrate and the system board are coupled to the metal shielding in the package substrate and the metal shielding in the system board.

2. The passive device of claim 1, further comprising a core material that at least partially fills the coupling space between the package substrate and the system board.

3. The passive device of claim 1, wherein the plurality of solder balls surrounding the coupling space between the package substrate and the system board are coupled to ground.

4. The passive device of claim 1, wherein the metal shielding in the package substrate and the metal shielding in the system board are coupled to ground.

5. A transformer comprising:
   a first inductor in a package substrate, wherein the package substrate comprises metal shielding;
   a second inductor in a system board, wherein the system board surrounding the transformer comprises metal shielding, the second inductor being electromagnetically coupled to the first inductor across a coupling space between the package substrate and the system board;
   wherein the coupling space between the package substrate and the system board is surrounded by a plurality of solder balls that couple the package substrate to the system board, wherein the plurality of solder balls surrounding the coupling space between the package substrate and the system board are coupled to the metal shielding in the package substrate and the metal shielding in the system board.

6. The transformer of claim 5, further comprising a ferromagnetic material that at least partially fills the coupling space between the package substrate and the system board.

7. The transformer of claim 5, wherein the first inductor and the second inductor are coupled to one of the plurality of solder balls surrounding the coupling space between the package substrate and the system board, and the one of the plurality of solder balls is coupled to ground.

8. The transformer of claim 5, wherein the plurality of solder balls surrounding the coupling space between the package substrate and the system board are coupled to ground.

9. The transformer of claim 5, wherein the metal shielding in the package substrate and the metal shielding in the system board are coupled to ground.

10. The transformer of claim 5, wherein the first inductor is coupled to a radio-frequency circuit and the second inductor is coupled to an antenna.

11. The transformer of claim 10, wherein the transformer is adapted to be the only passive circuit in the path between the radio-frequency circuit and the antenna.

12. A capacitor comprising:
    a first capacitive plate in a package substrate, wherein the package substrate comprises metal shielding;
    a second capacitive plate in a system board, wherein the system board surrounding the capacitor comprises metal shielding, the second capacitive plate being electromagnetically coupled to the first capacitive plate across a coupling space between the package substrate and the system board;
    wherein the coupling space between the package substrate and the system board is surrounded by a plurality of solder balls that couple the package substrate to the system board, wherein the plurality of solder balls surrounding the coupling space between the package substrate and the system board are coupled to the metal shielding in the package substrate and the metal shielding in the system board.

13. The capacitor of claim 12, further comprising a dielectric material that at least partially fills the coupling space between the package substrate and the system board.

14. The capacitor of claim 12, wherein the plurality of solder balls surrounding the coupling space between the package substrate and the system board are coupled to ground.

15. The capacitor of claim 12, wherein the metal shielding in the package substrate and the metal shielding in the system board are coupled to ground.

16. The passive device of claim 1, wherein the passive device is incorporated into a device, wherein the device is at least one of a cell phone, a hand-held personal communication system unit, a portable data unit, or a fixed location data unit.

17. The transformer of claim 5, wherein the transformer is incorporated into a device, wherein the device is at least one of a cell phone, a hand-held personal communication system unit, a portable data unit, or a fixed location data unit.

18. The capacitor of claim 12, wherein the capacitor is incorporated into a device, wherein the device is at least one of a cell phone, a hand-held personal communication system unit, a portable data unit, or a fixed location data unit.

* * * * *